United States Patent
Kim et al.

(10) Patent No.: US 7,858,978 B2
(45) Date of Patent: Dec. 28, 2010

(54) NONVOLATILE ORGANIC BISTABLE MEMORY DEVICE AND METHOD OF MANUFACTURING THE SAME

(75) Inventors: Tae-Whan Kim, Seoul (KR); Fushan Li, Seoul (KR); Young-Ho Kim, Seoul (KR); Jae-Hun Jung, Seoul (KR)

(73) Assignees: Samsung Electronics Co., Ltd., Suwon-si, Gyeonggi-do (KR); Industry-University Cooperation Foundation, Seoul (KR)

( * ) Notice: Subject to any disclaimer, the term of this patent is extended or adjusted under 35 U.S.C. 154(b) by 204 days.

(21) Appl. No.: 12/326,936

(22) Filed: Dec. 3, 2008

(65) Prior Publication Data

US 2009/0146140 A1    Jun. 11, 2009

(30) Foreign Application Priority Data

Dec. 5, 2007   (KR) .............................. 2007-125742

(51) Int. Cl.
*H01L 51/10* (2006.01)
*H01L 51/30* (2006.01)

(52) U.S. Cl. .......... 257/40; 257/E51.008; 257/E51.025; 257/E51.027; 257/E51.039; 257/E51.04; 365/148; 977/735; 977/742; 977/779; 977/785; 977/943

(58) Field of Classification Search .................... 257/40, 257/E51.008, E51.01, E51.011, E51.025, 257/E51.027, E51.028, E51.031, E51.032, 257/E51.033, E51.035, E51.036, E51.038, 257/E51.039, E51.04; 365/148; 977/734, 977/735, 742, 750, 752, 773, 778, 779, 785, 977/810, 811, 943

See application file for complete search history.

(56) References Cited

U.S. PATENT DOCUMENTS

| 7,075,105 | B2 * | 7/2006 | Kano ........................... 257/40 |
| 7,354,647 | B2 * | 4/2008 | Kano ....................... 428/411.1 |
| 7,705,707 | B2 * | 4/2010 | Lian et al. ..................... 338/20 |
| 2005/0056877 | A1 | 3/2005 | Rueckes et al. |
| 2005/0274943 | A1 * | 12/2005 | Chen ........................... 257/40 |
| 2008/0152792 | A1 * | 6/2008 | Lian et al. ................ 427/126.1 |

FOREIGN PATENT DOCUMENTS

| KR | 1020030068029 A | 8/2003 |
| KR | 1020050096224 A | 10/2005 |
| KR | 1020060032099 A | 4/2006 |

(Continued)

OTHER PUBLICATIONS

KR20070125742, Foreign priority document electronically retrieved by examiner from KIPO.*

(Continued)

*Primary Examiner*—Richard Elms
*Assistant Examiner*—Michael Lulis
(74) *Attorney, Agent, or Firm*—Volentine & Whitt, PLLC

(57) ABSTRACT

A nonvolatile organic bistable memory device includes a substrate, a lower electrode disposed on the substrate, a lower charge injection layer disposed on the lower electrode, an insulating polymer layer including nanoparticles disposed on the lower charge injection layer, an upper charge injection layer disposed on the insulating polymer layer, and an upper electrode disposed on the upper charge injection layer. The lower and upper charge injection layers each include fullerenes and/or carbon nanotubes.

10 Claims, 6 Drawing Sheets

FOREIGN PATENT DOCUMENTS

| | | |
|---|---|---|
| KR | 100622229 B1 | 9/2006 |
| KR | 1020060108088 A | 10/2006 |
| KR | 100654361 B1 | 11/2006 |

OTHER PUBLICATIONS

Xiangjun Wang et al., "Enhanced Photocurrent Spectral Response in Low-Bandgap Polyfluorene and C7-Derivative-Based Solar Cells" Adv. Funct. Mater. 2005, 15 1665-670.

Y. Yuan et al., "Fullerence-doped hole transport molecular films for organic light-emitting diodes", Applied Physics Letters 86, 143509 (2005).

Sijin Han et al., "Highly efficient organic light-emitting diodes with metal/fullerence anode" Journal of Applied Physics 100, 074504 (2006).

* cited by examiner

NONVOLATILE ORGANIC BISTABLE MEMORY DEVICE AND METHOD OF MANUFACTURING THE SAME

PRIORITY CLAIM

A claim of priority under 35 U.S.C. §119 is made to Korean Patent Application No. 10-2007-0125742, filed Dec. 5, 2007, the entire contents of which are hereby incorporated by reference.

SUMMARY

The present invention generally relates to a semiconductor device and to a method of manufacturing a semiconductor device, and more particularly, the present invention to a nonvolatile memory device and to a method of manufacturing a nonvolatile memory device.

A representative nonvolatile memory device is a flash memory device having an electrically isolated floating gate. One advantage of a flash memory device resides in a relatively high speed read operation. For example, the read time may be 100 nanoseconds (ns) or less at high speed. However, the write operation and erase operations take considerably longer to execute. For example, the write operation may take about 1 microsecond (μs), and the erase operation may take hundreds of milliseconds (ms).

As mentioned above, the present invention relates to nonvolatile memories. More precisely, the present invention provides a nonvolatile organic bistable memory device which allows for an increase an on/off current ratio of the device such that an operation speeds can be increased. The present invention also provides a method of manufacturing a nonvolatile organic bistable memory device.

Embodiments of the present invention provide nonvolatile organic bistable memory devices which include a substrate, a lower electrode disposed on the substrate, a lower charge injection layer disposed on the lower electrode and including at least one of fullerene and a carbon nanotube, an insulating polymer layer disposed on the lower charge injection layer and including a nanoparticle, an upper charge injection layer disposed on the insulating polymer layer and including at least one of fullerene and a carbon nanotube, and an upper electrode disposed on the upper charge injection layer.

In other embodiments of the present invention, methods of manufacturing a nonvolatile organic bistable memory device include forming a lower electrode on a substrate, forming a lower charge injection layer including at least one of fullerene and a carbon nanotube on the lower electrode, forming an insulating polymer layer including a nanoparticle on the lower charge injection layer, forming an upper charge injection layer including at least one of fullerene and a carbon nanotube on the insulating polymer layer, and forming an upper electrode on the upper charge injection layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
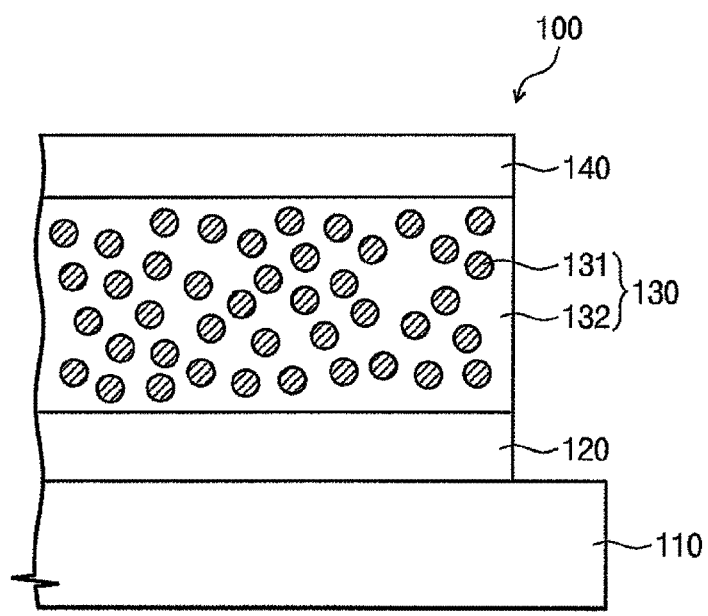
FIG. 1 is a schematic view illustrating the structure of a typical nonvolatile organic bistable memory device.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2:
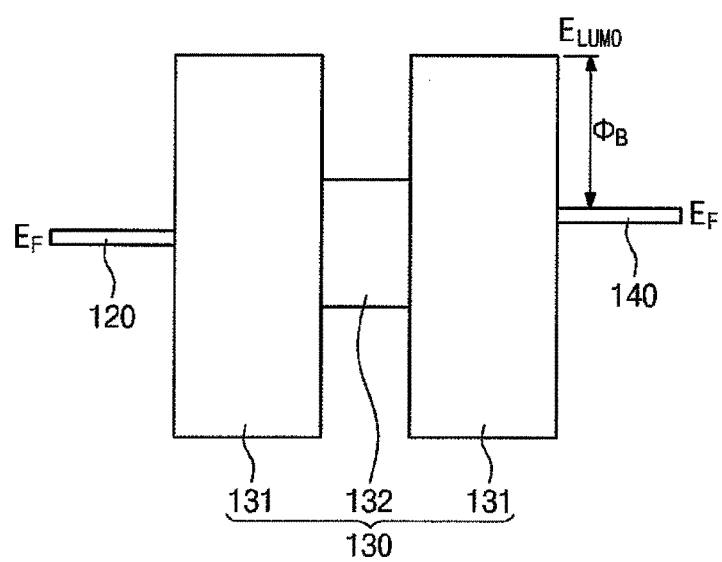
FIG. 2 is an energy band diagram of a typical nonvolatile organic bistable memory device.

FIG. 1 is a schematic view illustrating the structure of a nonvolatile organic bistable memory device 100, and FIG. 2 is an energy band diagram of the nonvolatile organic bistable memory device 100 illustrated in FIG. 1.

Referring to FIGS. 1 and 2, the nonvolatile organic bistable memory device 100 includes a substrate 110, a lower electrode 120, a polymer film 130, and an upper electrode 140. As shown, the polymer film 130 includes a polymer material 132 and nanoparticles 131.

A circuit may be configured applying a positive pole to the lower electrode 120 and a negative pole to the upper electrode 140. The state where electrons are not confined in the nanoparticles 131 included in the polymer layer 130 is defined as state "1", and the state where electrons are confined in the nanoparticles 132 is defined as state "0". The state "1" corresponds to an "on" state of the device 100, and the state "0" corresponds to an "off" state of the device 100.

In an initial state of the device 100, the state "1" exists since electrons are not confined in the nanoparticles 131. In this state, when a voltage is applied to the circuit, electrons injected through the upper electrode 140 (to which the negative pole is applied) are confined in the nanoparticles 131. Processes where electrons are confined in the nanoparticles 131 are classified into two types. In one type, electrons move through an energy barrier $\phi_B$ illustrated in FIG. 2 using a tunneling phenomenon and are directly confined in the nanoparticles 131. In the other type, electrons surmount the energy barrier $\phi_B$ through a thermionic emission process and are injected into a polymer material 132, so that the electrons are confined in the nanoparticles 131. The energy barrier $\phi_B$ corresponds to the difference between the Fermi level ($E_F$) of the upper electrode 140 and the lowest energy level $E_{LUMO}$ of the polymer material 132 where electrons are absent.

When a voltage of a predetermined value or more is applied, electrons are confined in all of the nanoparticles 131, so that the state of the device 100 is changed to the state "0", and the electrons confined in the nanoparticles 131 interfere with electron movement to increase resistance and reduce current flow. A ratio in the amount of current flowing through the device 100 in the state "1" and in the state "0" is measured to obtain an on/off current ratio of the device 100.

The circuit may alternatively be configured such that a positive pole is applied to the upper electrode 140, and a negative pole is applied to the lower electrode 120. In this case, when a voltage of a predetermined value or more is applied, electrons confined in the nanoparticles 131 are emitted to change the state "0" to the state "1".

The above-described nonvolatile organic bistable memory device includes a polymer having high insulating characteristics and a high energy band gap, to prevent leakage of electric charges confined in nanoparticles or impurity traps inside the polymer, thereby exhibiting long-term memory characteristics. However, since the molecules themselves have high insulating characteristics, the amount of current flowing through the devices is reduced in a read operation, thereby reducing the on/off current ratio of the devices.

Figure 3:
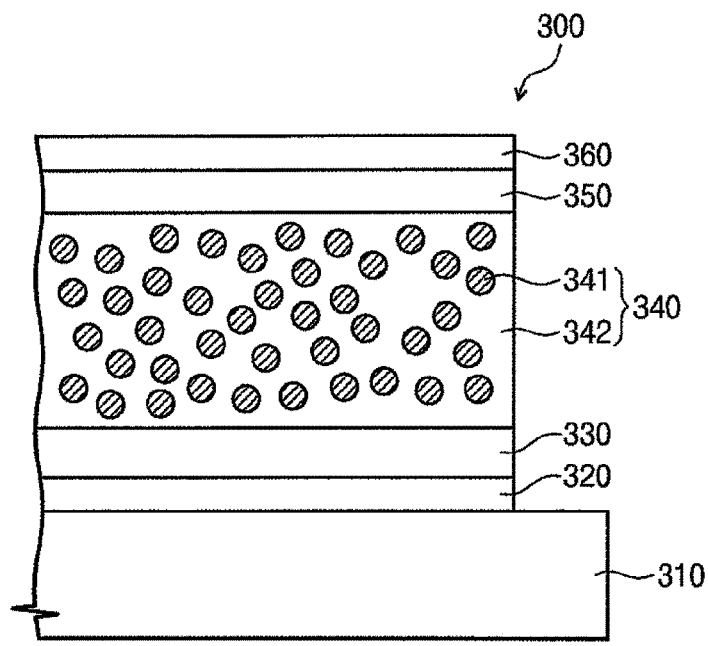
FIG. 3 is a schematic view illustrating the structure of a nonvolatile organic bistable memory device according to an embodiment of the present invention.

FIG. 3 is a schematic view illustrating the structure of a nonvolatile organic bistable memory device 300 according to an embodiment of the present invention.

Referring to FIG. 3, the nonvolatile organic bistable memory device 300 includes a substrate 310, a lower electrode 320, a lower charge injection layer 330, a polymer layer 340, an upper charge injection layer 350, and an upper electrode 360.

The substrate 310 may be an insulating inorganic substrate or an insulating organic substrate. Examples of the insulating inorganic substrate include Si, GaAs, InP, $Al_2O_3$, SiC, glass, and quartz. Examples of the insulating organic substrate include poly ethylene terephthalate (PET), poly styrene (PS), polyimide (PI), poly vinyl chloride (PVC), poly vinyl pyrrolidone (PVP), and poly ethylene (PE).

The lower electrode 320 is formed of a conductive material on the substrate 310. As examples, the lower electrode 320 may include one or more of Al, Au, Cu, Pt, Ag, W, and indium tin oxide (ITO).

The lower charge injection layer 330 is located on the lower electrode 320 and is formed of a material exhibiting favorable charge transfer characteristics. For example, the lower charge injection layer 330 may include fullerenes and/or carbon nanotubes. The fullerenes may, for example, be constituted by $C_{60}$ fullerenes, by higher order fullerenes such as $C_{60}$, $C_{70}$, $C_{76}$, $C_{78}$, $C_{82}$, $C_{90}$, $C_{94}$, or $C_{96}$ fullerenes, or by a combination thereof. The carbon nanotubes may, for example, be one or more of single-wall carbon nanotubes, multi-wall carbon nanotubes, and bundled carbon nanotubes.

The polymer layer 340 is disposed on the lower charge injection layer 330. The polymer layer 340 includes an insulating polymer material 342 with nanoparticles 341 embedded therein. The insulating polymer material 342 may, for example, be any one or more of poly-N-vinylcarbazole (PVK), poly-4-vinylphenol (PVP), poly styrene (PS), polyimide (PI), poly(fluorenyl-2,7-vinylene) (PFV), poly(2-methhoxy-5-(2-ethylhexyloxy)-1,4-pheneylenevinylene) (PEH-PPV), and copolymerized fluorenyl vinylene with PPV (poly(FV-co-PV)). The nanoparticles 341 may, for example, be any one or more of Au, Ag, Pd, Pt, ZnO, $Cu_2O$, $SnO_2$, $Al_2O_3$, $Ni_{1-x}Fe_xO$, MgO, $Zn_{1-x}Cu_xO$, $HfO_2$, $Ga_2O_3$, BaO, $Ta_2O_5$, $TiO_2$, $ZrO_2$, $ZrSi_xO_y$, $HfSi_xO_y$, $SrTiO_3$, $Zn_{1-x}Cd_xO$, $Zn_{1-x}Mn_xO$, $Zn_{1-x}Co_xO$, $Sb_2O_3$, $Zn_{1-x}Mg_xO_3$, and $Zn_{1-x}S_xO$.

The upper charge injection layer 350 may be formed of fullerene or carbon nanotubes, which have excellent charge transfer characteristics, on the polymer layer 340. For example, the upper charge injection layer 350 may be formed of the same material as that of the lower charge injection layer 330. The upper electrode 360 is formed of a conductive material on the upper charge injection layer 350, and may include any one of Al, Au, Cu, Pt, Ag, W, and ITO, like the lower electrode 320.

Figure 4:
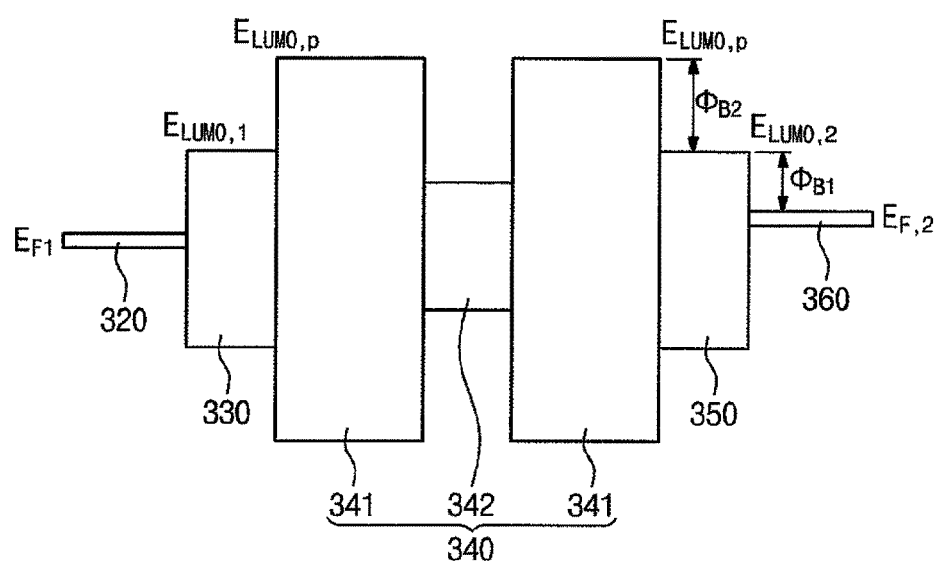
FIG. 4 is an energy band diagram of a nonvolatile organic bistable memory device according to an embodiment of the present invention.

FIG. 4 is an energy band diagram of the nonvolatile organic bistable memory device 300. $E_{F,\,1}$ refers to the Fermi level of the lower electrode 320, and $E_{F,\,2}$ refers to the Fermi level of the upper electrode 360. $E_{LUMO,\,1}$ refers to the lowest energy level of the lower charge injection layer 330 where electrons are absent, and $E_{LUMO,\,2}$ refers to the lowest energy level of the upper charge injection layer 350 where electrons are absent, and $E_{LUMO,\,p}$ refers to the lowest energy level of the polymer material 342 where electrons are absent.

For the charge injection layers 330 and 350 to exhibit favorable charge transfer characteristics, the difference between $E_{LUMO,\,1}$ and $E_{F,\,1}$ is designed to be less than that between $E_{LUMO,\,1}$ and $E_{LUMO,\,P}$, and the difference between $E_{LUMO,\,2}$ and $E_{F,\,2}$ is designed to be less than that between $E_{LUMO,\,2}$ and $E_{LUMO,\,p}$.

A negative pole is applied to the upper electrode 360 of the nonvolatile organic bistable memory device 300, and a positive pole is applied to the lower electrode 320, and electrons are supplied through the upper electrode 360 as described previously in connection with FIG. 1. If the upper charge injection layer 350 is not present the electrons must surmount an energy barrier corresponding to $\phi_B$. However, in the case where the upper charge injection layer 350 is present, electrons injected from the upper electrode 360 surmount a first energy barrier $\phi_{B1}$ that is the difference between $E_{LUMO,\,2}$ and $E_{F,\,2}$, so that the electrons are injected into the upper charge injection layer 350.

The electrons injected into the upper charge injection layer 350 penetrate a second energy barrier $\phi_{B2}$ that is the difference between $E_{LUMO,\,2}$ and $E_{F,\,2}$, by a tunneling phenomenon, so that the electrons are directly confined in the nanoparticles 341, or the electrons are, through a thermionic emission process, injected into the polymer material 342 and then confined in the nanoparticles 341.

Since the upper charge injection layer 350 is provided such that the difference between $E_{LUMO,\,2}$ and $E_{F,\,2}$ is less than that between $E_{LUMO,\,2}$ and $E_{LUMO,\,p}$, the electrons may easily surmount the first energy barrier $\phi_{B1}$. Thus, the electrons are required to penetrate substantially only the second energy barrier $\phi_{B2}$. As a result, since the second energy barrier $\phi_{B2}$ that the electrons are required to penetrate is less than the energy barrier $\phi_B$ when the charge injection layers 330 and 350 are not present, the energy barrier of the nonvolatile organic bistable memory device 300 may be reduced.

In the above description, the negative pole is applied to the upper electrode 360, and the positive pole is applied to the lower electrode 320. However, the negative pole may instead be applied to the lower electrode 320, and the positive pole may be applied to the upper electrode 360. In either case, when the injection layers 330 and 350 are disposed between the respective electrodes 310 and 360 and the polymer layer 340, the energy barrier of the entire nonvolatile organic bistable memory device 300 is reduced and the amount of current flowing through the entire nonvolatile organic bistable memory device 300 is increased. Since the amount of current is exponentially increased in inverse proportion to the energy barrier of the nonvolatile organic bistable memory device 300, even when the energy barrier is just slightly reduced, the amount of current flowing through the device 300 is significantly increased.

Figure 5:
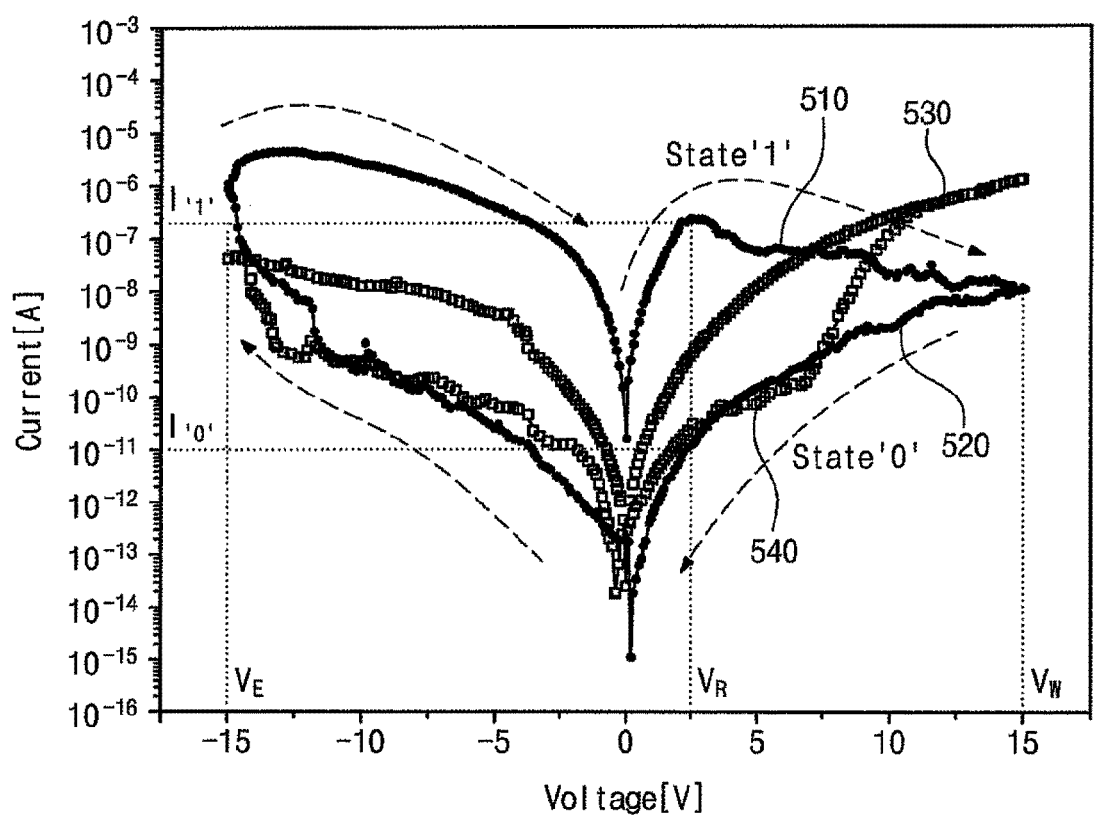
FIG. 5 is a current-voltage graph obtained from structures of both a typical nonvolatile organic bistable memory device and a nonvolatile organic bistable memory device according to an embodiment of the present invention.

FIG. 5 is a graph of current versus voltage, obtained from the structures of both the nonvolatile organic bistable memory device 100 of FIG. 1 and the nonvolatile organic bistable memory device 300 of FIG. 3. As described with FIGS. 1 and 2, the state where electrons are not confined in the nanoparticles 131 and 341 included in the polymer layers 130 and 340 is defined as "1", and the state where electrons are confined in the nanoparticles 131 and 341 is defined as "0". The state "1" corresponds to the on state of the devices 100 and 300, and the state "0" corresponds to the off state of the devices 100 and 300. A curve 510 corresponds to the state "1" of the nonvolatile organic bistable memory device 300, and a curve 520 corresponds to the state "0" of the nonvolatile organic bistable memory device 300. A curve 530 corresponds to the state "1" of the nonvolatile organic bistable memory device 100, and a curve 540 corresponds to the state "0" of the nonvolatile organic bistable memory device 100.

Referring to the curves 510 and 520 of FIG. 5, in the nonvolatile organic bistable memory device 300, current $I_{\cdot 1}$, flowing at a read voltage $V_R$ of about 2.5 V in the state "1" is about 200 nA, and current $I_{\cdot 0}$, flowing in the state "0" is 0.01 nA, so that an on/off current ratio is about 20000 or more. On the other hand, in the nonvolatile organic bistable memory device 100, the on/off current ratio at the read voltage $V_R$ of about 2.5 V is just about 100 according to the curves 530 and 540. Although the on/off current ratio may be increased to about 200 in the case where a read voltage is increased, the ratio of about 200 is less about 100 times than that (about 20000) of the nonvolatile organic bistable memory device 300, and as a read voltage is increased, the amount of power consumed is also increased. As a result, the nonvolatile organic bistable memory device 300 exhibits a relatively high on/off current ratio at a low read voltage.

When a write voltage $V_W$ of about 15V is applied, substantially all electrons may be confined in the nanoparticles 341, so that the state "1" is changed to the state "0". When an erase voltage $V_E$ of about −15 V is applied, substantially all electrons confined in the nanoparticles 341 may be emitted to the outside, so that the state "0" is changed into the state "1".

Figure 6:
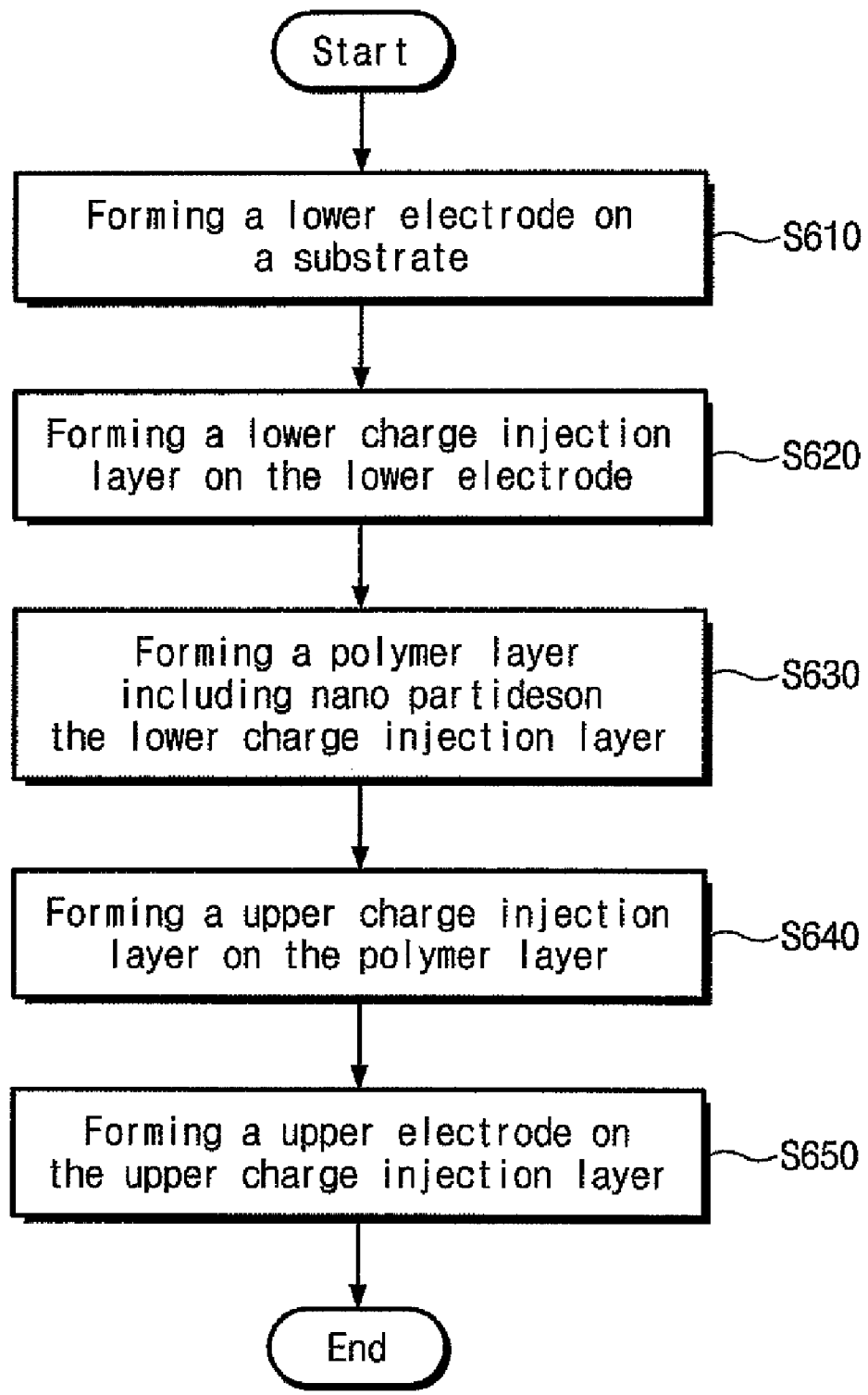
FIG. 6 is a flowchart illustrating a method of manufacturing a nonvolatile organic bistable memory device according to an embodiment of the present invention.

FIG. 6 is a flowchart illustrating a method of manufacturing the nonvolatile organic bistable memory device 300 according to an embodiment of the present invention.

Referring to FIG. 6, at S610, the lower electrode 320 is formed on the substrate 310. The lower electrode 320 is formed by depositing, for example, any one of Al, Au, Cu, Pt, Ag, W, and ITO, and then by patterning the deposited material using an etching process. The deposition process may, for example, be one of a sputtering process or thermal evaporation process.

At S620 of FIG. 6, the lower charge injection layer 330 is formed on the lower electrode 320. At this point, referring to FIG. 4, the difference between $E_{LUMO, 1}$ and $E_{F, 1}$ is less than that between $E_{LUMO, 1}$ and $E_{LUMO, p}$, such that the lower charge injection layer 330 exhibits favorable charge transfer characteristics. The lower charge injection layer 330 may be formed of fullerenes or carbon nanotubes. The fullerenes may be $C_{60}$ fullerenes, or high-order fullerenes such as $C_{70}$, $C_{76}$, $C_{78}$, $C_{82}$, $C_{90}$, $C_{94}$, and $C_{96}$ fullerenes, or a combination thereof. The carbon nanotubes may be single-wall carbon nanotubes, multi-wall carbon nanotubes, bundled carbon nanotubes, or a combination thereof. To form the lower charge injection layer 330, at least one of the fullerenes and the carbon nanotubes are dissolved in a solvent to form a solution, and the formed solution is applied on the lower electrode 320 using a spin-coating method, and then the solvent is removed. The solvent may, for example, be any one or more of 1,2-dicloroethane ($C_2H_4Cl_2$), toluene, acetone, chloroform, ethyleneglycol, isopropanol, xylene.

At S630 of FIG. 6, the polymer layer 340 including nanoparticles 341 is formed on the lower charge injection layer 330. The insulating polymer material 342 may, for example, be any one or more of PVK (poly-N-vinylcarbazole), PVP (poly-4-vinyl-phenol), poly styrene (PS), polyimide (PI), poly(fluorenyl-2,7-vinylene) (PFV), poly(2-methhoxy-5-(2-ethylhexyloxy)-1,4-pheneylenevinylene) (PEH-PPV), copolymerized fluorenyl vinylene with PPV (poly(FV-co-PV)). The nanoparticle 341 may, for example, be any one or more of Au, Ag, Pd, Pt, ZnO, $Cu_2O$, $SnO_2$, $Al_2O_3$, $Ni_{1-x}Fe_xO$, MgO, $Zn_{1-x}Cu_xO$, $HfO_2$, $Ga_2O_3$, BaO, $Ta_2O_5$, $TiO_2$, $ZrO_2$, $ZrSi_xO_y$, $HfSi_xO_y$, $SrTiO_3$, $Zn_{1-x}Cd_xO$, $Zn_{1-x}Mn_xO$, $Zn_{1-x}Co_xO$, $Sb_2O_3$, $Zn_{1-x}Mg_xO_3$, $Zn_{1-x}S_xO$.

To form the polymer layer 340, a metal thin film is formed on the lower charge injection layer 330. A precursor polymer solution is prepared by dissolving, in a solvent, a precursor polymer material that is changed in a heat-treating process into the insulating polymer material 342. Then, the precursor polymer solution is applied on the metal thin film using a spin coating process, and the solvent is removed, so that a thin film including the precursor polymer material is formed. Then, the metal thin film and the thin film including the precursor polymer material are heat-treated, so that the insulating polymer layer 340 may be formed. In the case where the metal thin film is formed of any one of Au, Ag, Pd, and Pt, which are less reactive with oxygen, nanoparticles of metal are formed in the heat-treating process. In the case where the metal thin film is formed of highly reactive metal with oxygen, the metal reacts with oxygen included in the precursor polymer solution, so that nanoparticles of metal oxide may be formed. According to this technique of forming the polymer layer 340 having the nanoparticles 341, the nanoparticles 341 may be spontaneously and efficiently formed without carrying out additional processes dedicated forming the nanoparticles 341, thereby reducing the overall number of processes.

At S640 of FIG. 6, the upper charge injection layer 350 is formed on the polymer layer 340. At this point, the difference between $E_{LUMO, 2}$ and $E_{F, 2}$ is less than that between $E_{LUMO, 1}$ and $E_{LUMO, p}$ such that the upper charge injection layer 350, like the lower charge injection layer 330, exhibits favorable charge transfer characteristics. The upper charge injection layer 350 is formed of fullerenes or carbon nanotubes. To form the upper charge injection layer 350, at least one of the fullerenes and the carbon nanotubes is dissolved in a solvent to form a solution, and the formed solution is applied on the polymer layer 340 using a spin-coating method, and then the solvent is removed. The solvent may, for example, be any one or more of 1,2-dicloroethane ($C_2H_4Cl_2$), toluene, acetone, chloroform, ethyleneglycol, isopropanol, xylene. The upper charge injection layer 350 may be formed of the same material as that of the lower charge injection layer 330, or the upper charge injection layer 350 may be formed of a different material than that of the lower charge injection layer 330.

At S650 of FIG. 6, the upper electrode 360 is formed on the upper charge injection layer 350. The upper electrode 360, like the lower electrode 320, is formed by depositing any one of Al, Au, Cu, Pt, Ag, W, and ITO (e.g., by using a sputtering process or thermal evaporation process), and then by patterning the deposited material using an etching process.

FIGS. 7A through 7F are schematic views for use in describing a method of manufacturing a nonvolatile organic bistable memory device according to an embodiment of the present invention. In this example, the upper and lower charge injection layers contain fullerene $C_{60}$, the lower electrode is formed of ITO, the upper electrode is formed of Al, and the polymer layer is a polyimide thin film containing ZnO nanoparticles. However, the invention is not limited to this particular example.

Figure 7:
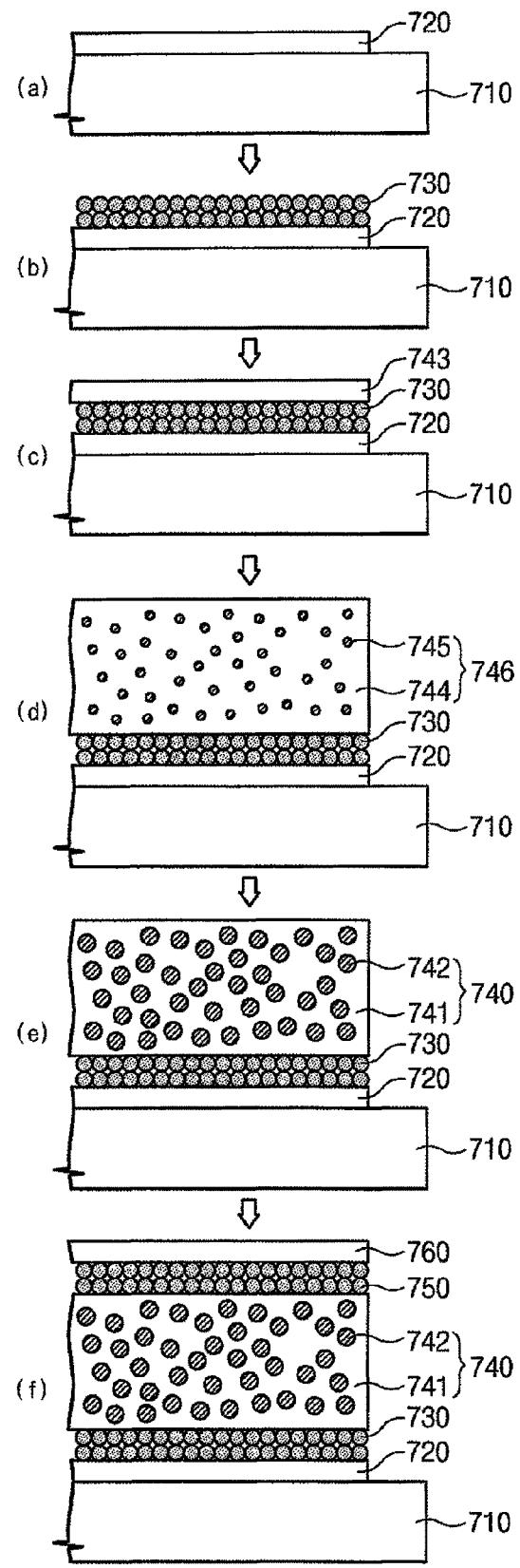
FIGS. 7A through 7F are schematic views for use in describing a method of manufacturing a nonvolatile organic bistable memory device according to an embodiment of the present invention.

Referring to FIG. 7A, an ITO electrode 720 is formed on an insulating substrate 710 through a sputtering process, and then is formed in an electrode shape through an etching process. The ITO electrode 720 corresponds to the lower electrode 320 of FIG. 3.

Figure 8:
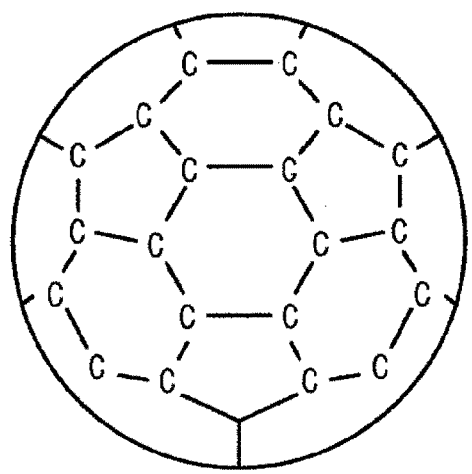
FIG. 8 is a schematic view illustrating the structure of fullerene $C_{60}$.

Molecules of fullerene $C_{60}$ having a so-called "buckyball" structure as illustrated in FIG. 8 are dissolved in a toluene solvent with a concentration of about 1 wt %, and then the solvent is agitated using an ultrasonic agitator for 2 hours such that the fullerene $C_{60}$ is uniformly distributed in the solvent to form a $C_{60}$ solution. The $C_{60}$ solution is deposited on the ITO electrode 720 in a thin film formed through a spin coating process. The spin coating may be performed for about 25 seconds at about 600 rpm. The thickness of a $C_{60}$ thin film to be formed can be controlled by varying the number of revolutions and the revolution time in the spin coating process.

After the spin coating process with the $C_{60}$ solution, the stacked structure including the substrate 710, the ITO electrode 720 and the fullerene $C_{60}$ is heated at about 170° C. for about 1 hour to remove the toluene solvent. As a result, a $C_{60}$ thin film 730 is formed as illustrated in FIG. 7B. The $C_{60}$ thin film 730 corresponds to the lower charge injection layer 330 of FIG. 3.

Then, referring to FIG. 7C, a Zn thin film 743, having a thickness of about 5 nm, is deposited on the $C_{60}$ thin film 730 through a sputtering process. Referring to FIG. 7D, the Zn thin film 743 is spin-coated with a biphenyltetracarboxylic dianhydride-p-phenylenediamine (BPDA-PDA)-type polyamic acid 744, using N-Methyl-2-Pyrrolidone (NMP) as a solvent. Through the spin coating, the Zn thin film 743 is dissolved to be present in Zn ion form by the polyamic acid 744. After the spin coating with the polyamic acid 744, a stacked structure of the substrate 710, the ITO electrode 720, the $C_{60}$ thin film 730 and a polyamic acid layer 746 (including dissolved Zn ions 745) is heated at about 135° C. for about 35 minutes, so that the NMP solvent is removed.

Figure 9:
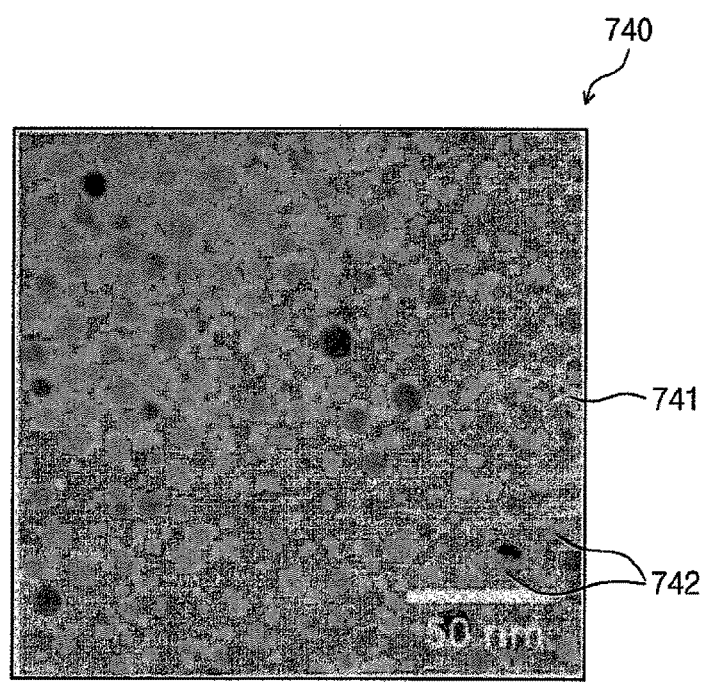
FIG. 9 is a plan-view transmission electron microscope image illustrating a polyimide thin film including spontaneously formed ZnO nanoparticles.

To cure the polyamic acid 744, the stacked structure of the substrate 710, the ITO electrode 720, the $C_{60}$ thin film 730 and a polyamic acid layer 746 (including dissolved Zn ions 745) is heat-treated in a nitrogen ($N_2$) atmosphere at about 350° C. for about 2 hours. After the heat-treatment, referring to FIG. 7E, the polyamic acid 744 is cured and converted to polyimide 741, and the Zn ions 745 dissolved in the polyamic acid 744 combine with oxygen of the polyamic acid 744 to form ZnO nanoparticles 742 in the polyimide 741. FIG. 9 is a plan-view transmission electron microscope image illustrating a resultant polyimide thin film 740 including the ZnO nanoparticles 742. As shown, the ZnO nanoparticles 742 are uniformly distributed in the polyimide 741.

The polyimide 741 corresponds to the insulating polymer material 342 of FIG. 3, and the ZnO nanoparticles 742 correspond to the nanoparticles 341 of FIG. 3. The polyimide thin film 740 including the ZnO nanoparticles 742 corresponds to the polymer layer 340 of FIG. 3.

Then, referring to FIG. 7F, using the same techniques as described above, a $C_{60}$ thin film 750 is formed on the polyimide thin film 740, and an Al electrode 760 is deposited on the C60 thin film 750 through a thermal evaporation process. The $C_{60}$ thin film 750 corresponds to the upper charge injection layer 350 of FIG. 3, and the Al electrode 760 corresponds to the upper electrode 360 of FIG. 3.

In the nonvolatile organic bistable memory device described above, charge injection layers having a relatively high charge transfer characteristic are disposed between the insulating polymer material and respective electrodes. This results in improved conductivity of the device in the "on" state, thereby improving the flow of electricity when compared to a device having only the insulating polymer material sandwiched between the electrodes. Thus, the on/off current ratio of the device is increased to better distinguish between memory states, and the resistance of the device is decreased to improve an operational speed of the device.

The method of manufacturing a nonvolatile organic bistable memory device as described above is adapted to allow the nanoparticles to be spontaneously formed in the insulating polymer material without an additional process, thereby simplifying the formation process and reducing production costs. Also, the charge injection layer can be formed through a relatively simple process including the spin coating.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile organic bistable memory device comprising:
    a substrate;
    a lower electrode disposed on the substrate;
    a lower charge injection layer disposed on the lower electrode and including at least one of fullerenes and carbon nanotubes;
    an insulating polymer layer disposed on the lower charge injection layer and including nanoparticles;
    an upper charge injection layer disposed on the insulating polymer layer and including at least one of fullerenes and carbon nanotubes; and
    an upper electrode disposed on the upper charge injection layer.

2. The device of claim 1, wherein at least one of the lower and upper charge injections layers comprises at least one of $C_{60}$, $C_{70}$, $C_{76}$, $C_{78}$, $C_{82}$, $C_{90}$, $C_{94}$, and $C_{96}$ fullerenes.

3. The device of claim 1, wherein at least one of the lower and upper charge injections layers comprises at least one of single-wall carbon nanotubes, multi-wall carbon nanotubes, and bundled carbon nanotubes.

4. The device of claim 1, wherein the lower charge injection layer and the upper charge injection layer comprise a same material.

5. The device of claim 1, wherein a polymer of the insulating polymer layer comprises at least one of PVK (poly-N-vinylcarbazole), PVP (poly-4-vinyl-phenol), poly styrene (PS), polyimide (PI), poly(fluorenyl-2,7-vinylene) (PFV), poly(2-methhoxy-5-(2-ethylhexyloxy)-1,4-pheneylenevinylene) (PEH-PPV), and copolymerized fluorenyl vinylene with PPV (poly(FV-co-PV).

6. The device of claim 1, wherein the nanoparticles comprise at least one of Au, Ag, Pd, Pt, ZnO, $Cu_2O$, $SnO_2$, $Al_2O_3$, $Ni_{1-x}Fe_xO$, MgO, $Zn_{1-x}Cu_xO$, $HfO_2$, $Ga_2O_3$, BaO, $Ta_2O_5$, $TiO_2$, $ZrO_2$, $ZrSi_xO_y$, $HfSi_xO_y$, $SrTiO_3$, $Zn_{1-x}Cd_xO$, $Zn_{1-x}Mn_xO$, $Zn_{1-x}Co_xO$, $Sb_2O_3$, $Zn_{1-x}Mg_xO_3$, and $Zn_{1-x}S_xO$.

7. The device of claim 1, wherein the lower electrode and the upper electrode independently comprise at least one of Al, Au, Cu, Pt, Ag, W, and indium tin oxide (ITO).

8. The device of claim 1, wherein the substrate comprises one of an insulating inorganic substrate and an insulating organic substrate.

9. The device of claim 8, wherein the insulating inorganic substrate comprises any one of Si, GaAs, InP, $Al_2O_3$, SiC, glass, and quartz.

10. The device of claim 8, wherein the insulating organic substrate comprises any one of poly ethylene terephthalate (PET), poly styrene (PS), polyimide (PI), poly vinyl chloride (PVC), poly vinyl pyrrolidone (PVP), and poly ethylene (PE).

* * * * *